(12) United States Patent
Fredenburg et al.

(10) Patent No.: US 11,128,308 B2
(45) Date of Patent: Sep. 21, 2021

(54) REGULATED CHARGE SHARING APPARATUS AND METHODS

(71) Applicant: Movellus Circuits Incorporated, Ann Arbor, MI (US)

(72) Inventors: Jeffrey Alan Fredenburg, Ann Arbor, MI (US); Yuxiang Mu, Ann Arbor, MI (US); Noman Hai, Mississauga (CA)

(73) Assignee: Movellus Circuits, Inc., Ann Arbor, MI (US)

( * ) Notice: Subject to any disclaimer, the term of this patent is extended or adjusted under 35 U.S.C. 154(b) by 0 days.

(21) Appl. No.: 16/875,790

(22) Filed: May 15, 2020

(65) Prior Publication Data

US 2021/0258015 A1 Aug. 19, 2021

Related U.S. Application Data

(60) Provisional application No. 62/977,599, filed on Feb. 17, 2020.

(51) Int. Cl.
*H03M 1/12* (2006.01)
*H03M 1/10* (2006.01)
*H02M 3/155* (2006.01)
*H02M 3/157* (2006.01)
*H03M 1/80* (2006.01)
*G05F 1/46* (2006.01)

(52) U.S. Cl.
CPC ........ *H03M 1/1009* (2013.01); *G05F 1/462* (2013.01); *H02M 3/155* (2013.01); *H02M 3/157* (2013.01); *H03M 1/12* (2013.01); *H03M 1/806* (2013.01)

(58) Field of Classification Search
CPC ........ H03M 1/806; H03M 1/12; G05F 1/462; H02M 3/155; H02M 3/157
USPC .............. 341/172, 155; 323/273, 282, 283
See application file for complete search history.

(56) References Cited

U.S. PATENT DOCUMENTS

| | | | |
|---|---|---|---|
| 5,365,129 A | 11/1994 | Slemmer | |
| 7,812,757 B1 | 10/2010 | Wong | |
| 8,421,658 B1 | 4/2013 | Yau | |
| 8,456,335 B2 | 6/2013 | Oshima | |
| 9,184,755 B2 | 11/2015 | Kimura | |
| 9,385,736 B2 | 7/2016 | Kimura | |
| 2007/0229038 A1 | 10/2007 | Lin | |
| 2010/0201555 A1 | 8/2010 | Karavidas | |
| 2013/0076546 A1 | 3/2013 | Wan | |
| 2014/0266118 A1* | 9/2014 | Chern | H02M 3/156 323/283 |
| 2015/0192943 A1* | 7/2015 | Roham | G05F 1/56 323/273 |
| 2017/0012639 A1 | 1/2017 | Bogner | |
| 2017/0346499 A1 | 11/2017 | Bode | |
| 2020/0313689 A1 | 10/2020 | Olieman | |

* cited by examiner

*Primary Examiner* — Joseph J Lauture
(74) *Attorney, Agent, or Firm* — Lance Kreisman; Peninsula Patent Group

(57) ABSTRACT

A charge sharing circuit includes a charge source having an accumulated first charge and a charge load having an accumulated second charge, where during a charge sharing interval the second charge is less than the first charge. A charge sharing regulator selectively couples between the charge source and the charge load along a charge sharing path. The charge sharing regulator regulates transfer of a shared amount of charge from the charge source to the charge load during the charge sharing interval.

20 Claims, 9 Drawing Sheets

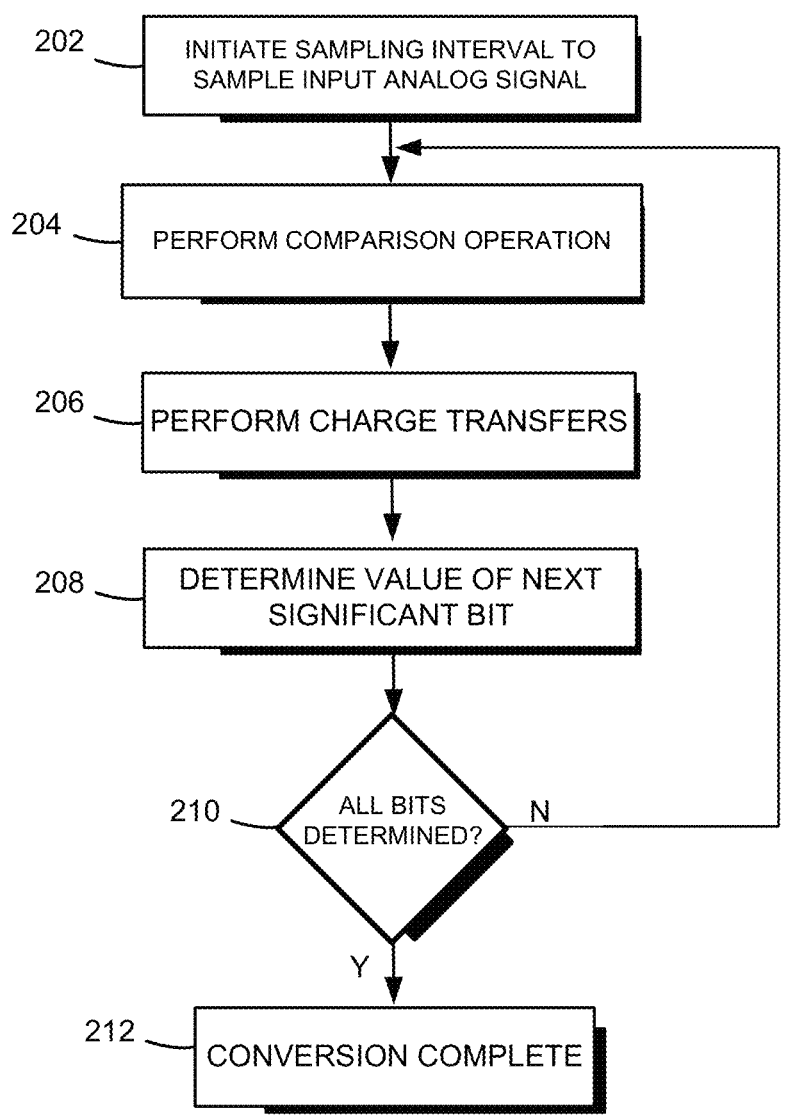

| $V_{REF}$ | Decision | Range | $V_{BIAS}$ |
|---|---|---|---|
| Positive | High | Insufficient | Increase |
| | Low | Excessive | Decrease |
| Negative | High | Excessive | Increase |
| | Low | Insufficient | Decrease |

REGULATED CHARGE SHARING APPARATUS AND METHODS

CROSS-REFERENCE TO RELATED APPLICATIONS

This application is a Non-Provisional of U.S. Ser. No. 62/977,599, filed Feb. 17, 2020, entitled CHARGE COUNTING ANALOG-TO-DIGITAL CONVERTER (ADC) APPARATUS AND METHODS, all of which is incorporated herein by reference in its entirety.

TECHNICAL FIELD

The disclosure herein relates to analog-to-digital conversion (ADC) circuits and methods, and more particularly ADC circuits and methods that utilize regulated charge sharing techniques.

BACKGROUND

Analog-to-digital converters (ADC) generally convert analog signals into corresponding digital signals. A variety of circuit architectures and methods have been proposed in the art, and generally work well for their intended applications. Improvements in accuracy and reduced circuit footprint, however, would be desirable.

BRIEF DESCRIPTION OF THE DRAWINGS

Embodiments of the disclosure are illustrated by way of example, and not by way of limitation, in the figures of the accompanying drawings and in which like reference numerals refer to similar elements and in which:

FIG. 2 illustrates a flowchart of steps involved in one embodiment of a method of operating the ADC of FIG. 1.

DETAILED DESCRIPTION

Embodiments of charge sharing circuits and methods are provided. In one embodiment, a charge sharing circuit includes a charge source having an accumulated first charge and a charge load having an accumulated second charge, where during a charge sharing interval the second charge is less than the first charge. A charge sharing regulator selectively couples between the charge source and the charge load along a charge sharing path. The charge sharing regulator regulates transfer of a shared amount of charge from the charge source to the charge load during the charge sharing interval. By regulating transfer of the shared amount of charge during the charge transfer interval, the precision and accuracy of charge transfers is significantly improved, while minimizing circuit area footprint.

Figure 1:
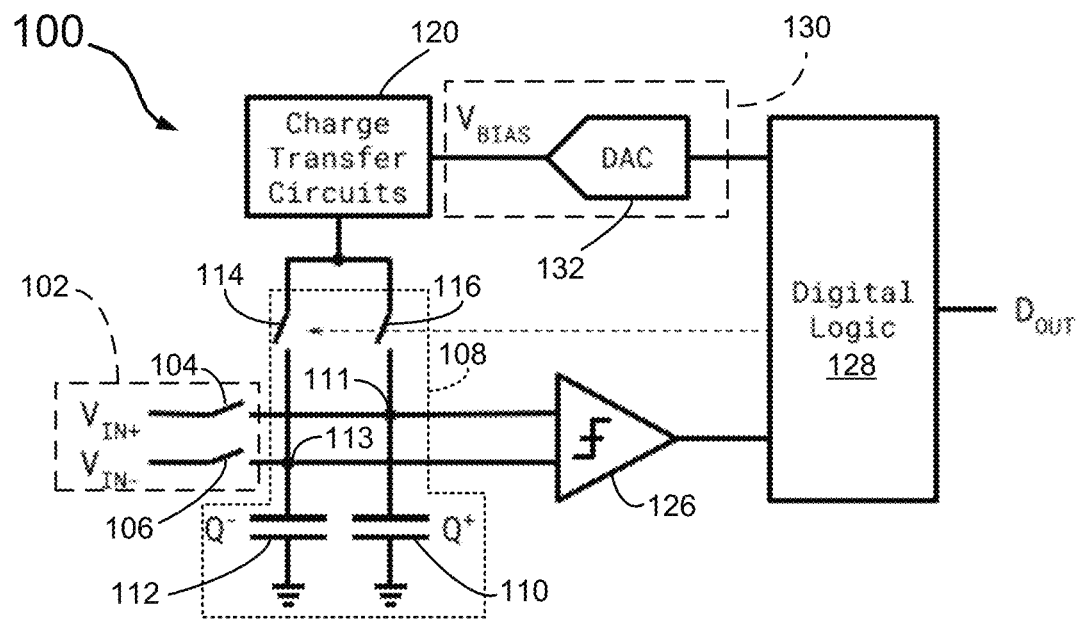
FIG. 1 illustrates one embodiment of an analog-to-digital converter (ADC).

FIG. 1 illustrates one embodiment of an analog-to-digital converter (ADC), generally designated 100, that may be used to convert an analog signal to a digital sequence of bits, or word. The ADC includes input circuitry 102 (in phantom) that, for one embodiment, includes respective switches 104 and 106. The switches selectively pass an input analog signal level, such as, for example, voltage $V_{IN}$ (here, shown as a differential voltage expressed by $V_{IN+}$ and $V_{IN-}$, although single-ended input voltages may also be received) to sampling circuitry 108. For one embodiment, the switches 104 and 106 are sequenced in a manner corresponding to a sampling interval, and controlled by digital logic 128, described more fully below.

With continued reference to FIG. 1, the sampling circuitry 108 includes first and second capacitor circuits 110 and 112 that connect to the switches 104 and 106, respectively. The first capacitor circuit 110 includes a first capacitor Q+ having a cathode terminal grounded, while the anode forms a node 111 with the positive input signal switch 104. The second capacitor circuit 112 includes a second capacitor Q− having its anode terminal grounded, while the cathode forms a node 113 with the negative input signal switch 106. For one embodiment, the capacitors Q+ and Q− are matched. Each of the capacitor circuits 110 and 112 include switches 114 and 116, controlled by the digital logic 128, that selectively couple to regulated charge sharing circuitry 120.

Further referring to FIG. 1, the regulated charge sharing circuitry 120 selectively couples to the sampling circuitry 108 via the switches 114 and 116 that are sequenced by the digital logic 128 during charge transfer intervals or sequences. Generally, the regulated charge sharing circuitry 120 extracts or injects (transfers) precise "units" of charge between itself and the first and second capacitor circuits based on certain conditions occurring during a given conversion interval. Specific embodiments of regulated charge sharing circuits are more fully described with reference to FIGS. 4-6 below.

The regulated charge sharing circuitry 120 generally injects or extracts the units of charge based on detection of a charge imbalance between the capacitor circuits 110 and 112. For one embodiment, the charge imbalance may be detected through use of a comparator circuit 126. The comparator circuit 126 detects the relative charge stored on each of the capacitor circuits 110 and 112 during a comparison interval, and generates a decision based on the comparison.

Further referring to FIG. 1, the decision generated by the comparator circuit 126 is fed to the digital logic 128. For one embodiment, the digital logic 128 takes the form of a state machine, and controls operation of the timing and generation of many of the sequences described herein. In addition to establishing overall control of the ADC sequencing, the digital logic 128 generates the multi-bit digital word or bit sequence $D_{OUT}$ corresponding to the input analog signal. While shown in FIG. 1 as a dedicated circuit, for some embodiments, the digital logic 128 may be shared when used in a multi-channel, parallel processing application.

With continued reference to FIG. 1, a feedback path 130 (in phantom) interconnects the digital logic 128 to the regulated charge sharing circuitry 120 such that a closed control loop is formed. The closed control loop thus includes the sampling circuitry 108, the comparator circuitry 126, the digital logic 128 and the regulated charge sharing circuitry 120. For one embodiment, a digital-to-analog converter (DAC) 132 may be disposed in the path 130 and responds to signals issued by the digital logic 128 to generate a control voltage $V_{BIAS}$ that controls the magnitude of each "unit" of charge involved in the charge transfers.

In operation, the ADC of FIG. 1 undergoes a general sequence of steps in converting the input analog voltage $V_{IN}$, to the digital word $D_{OUT}$. For one embodiment, the sequence of steps involves a search process, such as a binary search, to resolve the input analog value to a level within one LSB of a set of predefined possible values. Referring now to FIG. 2, the general sequence of steps involves initiating a sampling interval $T_S$ to sample the input analog signal, at 202. The sampling involves closing the input switches 104 and 106 to charge up the sampling capacitor circuits 110 and 112 to the analog voltage $V_{IN}$.

Further referring to FIG. 2, once the capacitor circuits 110 and 112 are charged, thereby completing the sampling operation, a first comparison operation is performed, at 204. The comparison generally compares the voltage on the capacitor circuits to generate a comparison decision. When the comparator decision goes high, the amount of charge stored on the positive capacitor, $Q^+$, is measured as larger than the amount of charge stored on the negative capacitor, $Q^-$. When the comparator decision goes low, the amount of charge stored on the positive capacitor, $Q^+$, is measured as smaller than the amount of charge stored on the negative capacitor, $Q^-$. The high/low result of the comparison decision forms the basis for the digital logic 128 generating a corresponding digital output bit at $D_{OUT}$.

With continued reference to FIG. 2, based on the comparator decision, the digital logic 128 connects one of the capacitor 110 or 112 to the regulated charge sharing circuitry 120, and a succession of charge sharing transfers is performed on the connected capacitor circuit, at 206, in an attempt to reduce the difference in charge between the positive capacitor, $Q^+$, and the negative capacitor, $Q^-$. For example, when the comparator decision goes high, the regulated charge sharing circuit will reduce (extract) the amount of charge on the positive capacitor, $Q^+$, which lowers the voltage on the positive capacitor. Conversely, when the comparator decision goes low, the regulated charge sharing circuit will reduce (inject) the amount of charge in the negative capacitor, $Q^-$, which raises the voltage on the negative capacitor.

Further referring to FIG. 2, as a result of the first series of charge sharing transfers during the first comparison interval, the digital logic 128 determines a value of the next significant bit of the digital word, at 208. For example, as a first step in a binary search, the expected full scale range may be halved based on the value of the generated MSB from the first comparison (where a logic "1" may represent the analog input value lying in the upper half of the expected full scale range, while a logic "0" would represent the value lying in the lower half). The next significant bit then directs the search process to the quarter-scale portion of the resolved half identified by the MSB, then determines if N bits have been converted, at 210. If not, then the process of FIG. 2 iterates, beginning with a subsequent comparison operation within the same sampling interval until the conversion is complete and an N-bit digital representation is produced, at 212.

Figure 3:
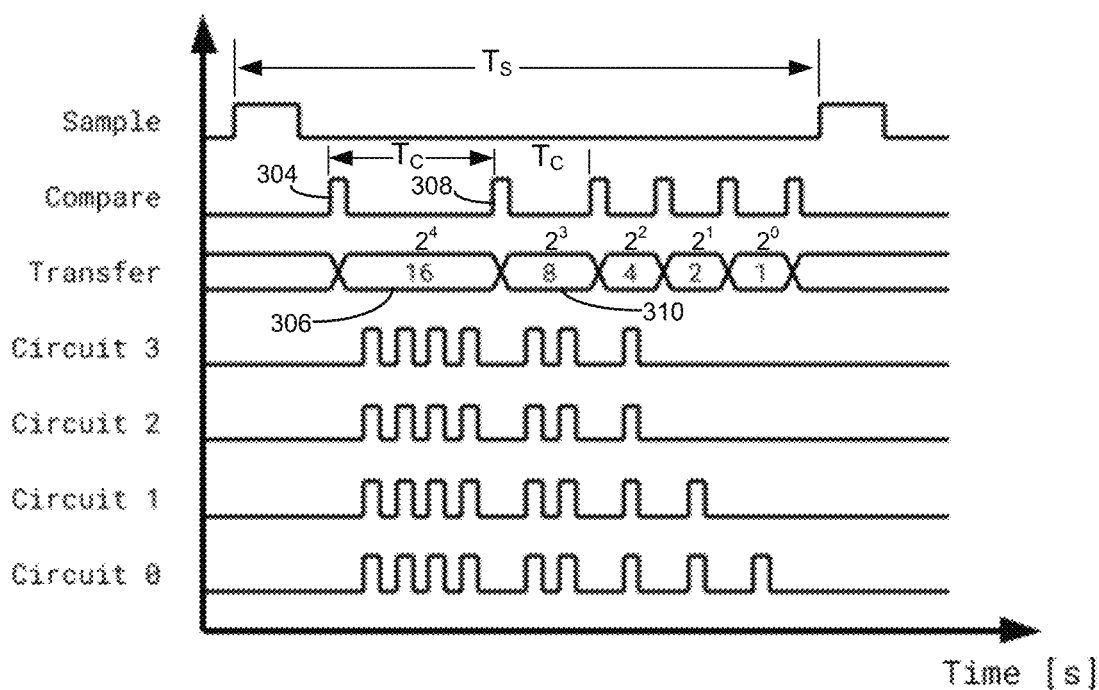
FIG. 3 illustrates the timing of certain circuit elements of the ADC of FIG. 1.
Figure 4:
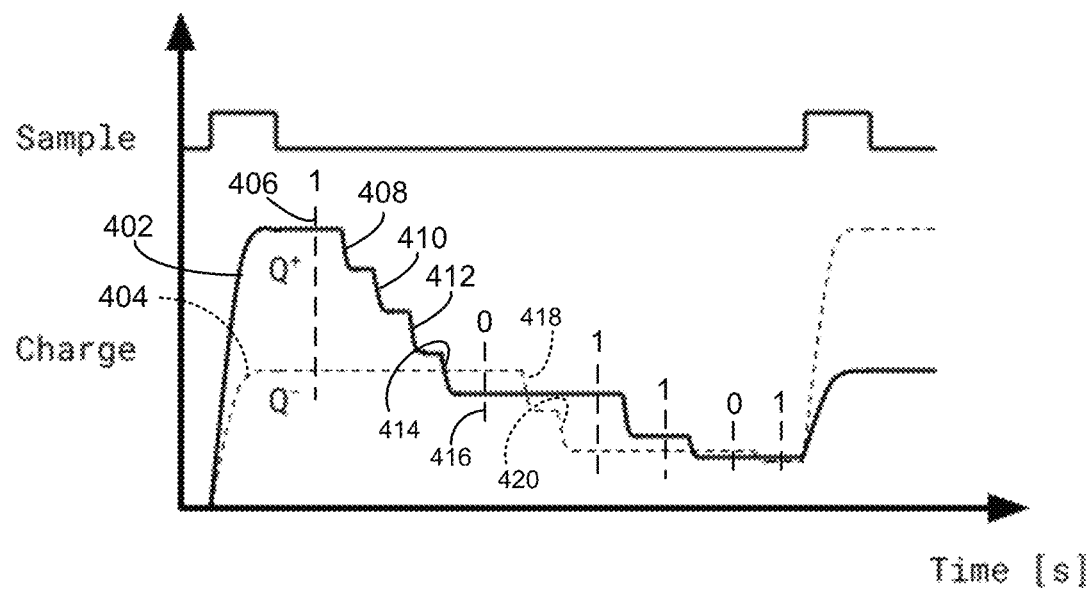
FIG. 4 illustrates the charge transfer timing of the sampling capacitors employed in the ADC of FIG. 1.

FIGS. 3 and 4 illustrate timing charts corresponding to a specific embodiment of a 6-bit ADC of FIG. 1, operating in accordance with the method described above with respect to FIG. 2. FIG. 3 plots a sampling interval $T_S$ with multiple compare intervals $T_C$, and showing a binary weighted pattern ($2^4$, $2^3$, $2^2$, $2^1$, and $2^0$) of charge sharing transfer pulses per compare interval, using a common time axis. FIG. 4 illustrates the dynamic change of relative charge between the capacitor circuits as a result of the charge sharing transfers.

Further referring to FIGS. 3 and 4, the detailed sequencing of steps to convert the analog input voltage to a digital word involves first initiating a sampling interval, shown at 302 FIG. 3), to charge the capacitor circuits, at 402 and 404 (FIG. 4). Once the charge levels settle, a first compare interval is initiated, at 304. Since the positive capacitor charge Q+ is higher than the charge on the negative capacitor Q−, at 406, the digital logic 128 assigns a logic "1" as the digital word MSB. The digital logic 128 then directs a first series of $2^4$ (sixteen) charge sharing transfers to take place, at 306, on the positive capacitor circuit through operation of four regulated charge sharing circuits (Circuit 3, Circuit 2, Circuit 1, Circuit 0) operating in parallel. The results of the four charge sharing sequences (sixteen total charge transfers) acting to reduce the charge on the positive capacitor are shown at 408, 410, 412 and 414. As an alternative, one regulated charge sharing circuit could be placed in operation to carry out the sixteen charge sharing transfers serially.

With continued reference to FIGS. 3 and 4, a second comparison interval is initiated, at 308. Since the resulting charge level Q− of the negative capacitor is higher than the charge Q+ on the positive capacitor, at 416, the digital logic 128 assigns a logic "0" as the next significant bit, and directs a second series of $2^3$ (eight) charge sharing transfers to take place, at 310, on the negative capacitor circuit through operation of two regulated charge sharing circuits in parallel. The results of the two charge sharing sequences (eight total charge transfers) acting to reduce the charge on the negative capacitor are shown at 418 and 420. The comparing and charge sharing transfer sequences continue until all of the N bits of the digital word are resolved.

As noted above, different configurations of regulated charge sharing circuits 120 can be used to optimize for area and speed, especially when employed in an integrated circuit (IC) chip. When a single regulated charge sharing circuit is used within the ADC, the charge sharing transfers can be repeated many times in a serial fashion to perform a binary search. The charge sharing transfers can be performed using a high-speed clock that runs faster than the sampling clock. This high-speed clock can be generated internally or provided externally. Following the first comparator decision, $2^{N-1}$ charge sharing transfers may be performed over $2^{N-1}$ internal clock cycles for an N bit ADC. Following the second comparator decision, $2^{N-2}$ charge sharing transfers may be performed in $2^{N-2}$ internal clock cycles for an N bit ADC. This is the slowest configuration of the ADC since it must repeat the charge sharing transfer for many cycles, but the area will also be the smallest.

When multiple regulated charge sharing circuits 120 are used in parallel, the number of charge sharing transfers may be controlled by both parallel and serial transfers to reduce processing time. Following the first comparator decision, $2^{N-1}$ charge sharing transfers may be performed over $2^{N-1}/M$ internal clock cycles for an N bit ADC using M parallel regulated charge sharing circuits. Following the second comparator decision, $2^{N-2}$ charge sharing transfers may be performed in $2^{N-2}/M$ internal clock cycles for an N bit ADC using M parallel regulated charge sharing circuits. Using multiple regulated charge sharing circuits often improves the operational speed of the ADC at the expense of circuit area.

For some embodiments, the dynamic range of the ADC is adjustable through the DAC output voltage, $V_{BIAS}$. When the DAC output voltage is increased, the amount of charge transferred by the regulated charge sharing circuit 120 increases which increases both the LSB and gain of the ADC. When the DAC output voltage is decreased, the amount of charge transferred by the regulated charge sharing circuit 120 decreases which decreases both the LSB and gain of the ADC. In some embodiments, the DAC may use the supply voltages as references. No external continuously used references are required by the charge counting ADC during a conversion operation. This advantageously eliminates the need for analog reference buffers. Moreover, low frequency drift in the supply voltage, which can introduce low frequency drift in the DAC output voltage, $V_{BIAS}$, can be mitigated by modulating the DAC control code (the input digital word to the DAC) to cancel the supply drift. For example, if the supply voltage goes high, the DAC control code can be reduced to maintain the same DAC output voltage, $V_{BIAS}$. If the supply voltage goes low, the DAC control code can be increased to maintain the same DAC output voltage.

Figure 5:
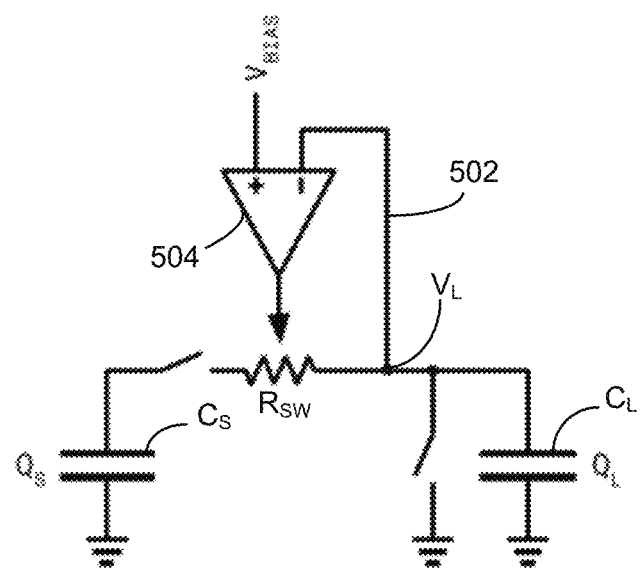
FIG. 5 illustrates one embodiment of a regulated charge sharing circuit employed in the ADC of FIG. 1.
Figure 6:
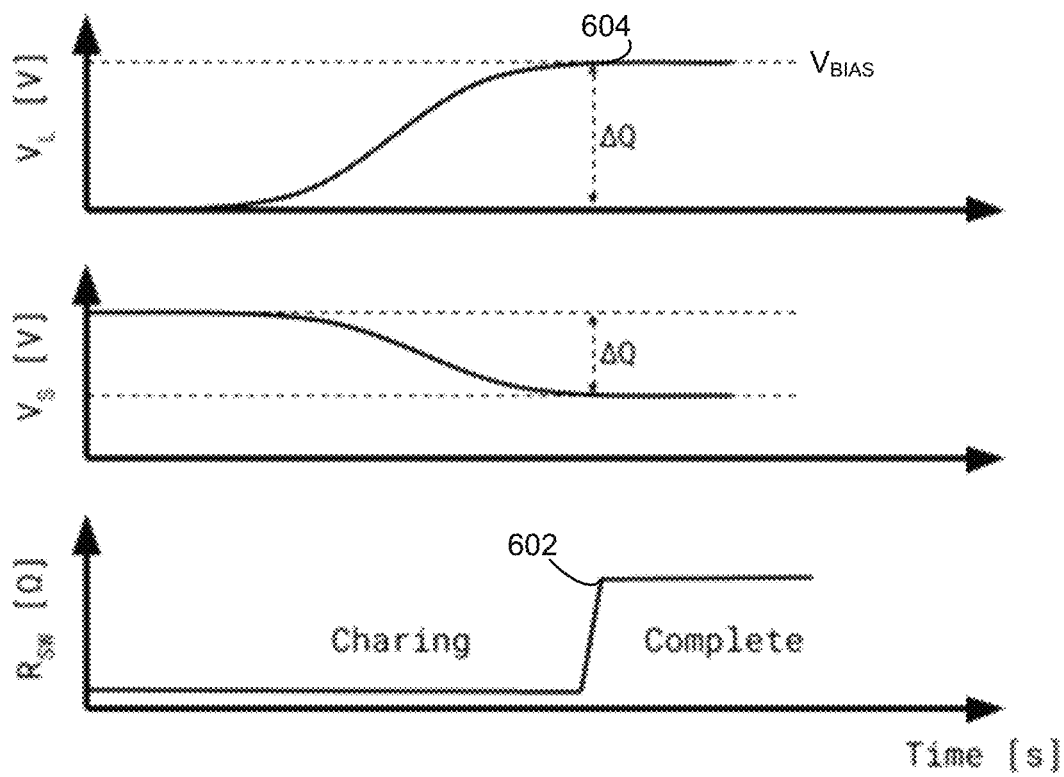
FIG. 6 illustrates graphs of load voltage $V_L$, source voltage $V_S$, and variable resistance $R_{SW}$ associated with operation of the charge transfer circuit of FIG. 5.

FIG. 5 illustrates further detail for one embodiment of a regulated charge sharing circuit, generally designated 500, that may be employed in the ADC of FIG. 1. The regulated charge sharing circuit couples to a source capacitor $C_S$ with a source charge, $Q_S$, and a load capacitor, $C_L$, with a load charge $Q_L$, through a variable resistance $R_{SW}$. The variable resistance $R_{SW}$ is modulated by a feedback path 502, including a comparator 504 that compares the difference between a voltage on the load capacitor, $V_L$, and a bias voltage, $V_{BIAS}$.

Charge sharing often refers to the process of transferring charge between capacitors until the voltages across the capacitors are equal. When the two capacitors with unequal voltages are connected together, an electric field forms between the two capacitors. The direction of this field flows from the capacitor node with higher potential to the lower potential node of the other capacitor, and in the presence of this electric field, electrons migrate from the lower potential capacitor to the higher potential capacitor. As the electrons move between the capacitors, the potential difference between the capacitors decreases until eventually equalizing. When the voltages across the two capacitors equalize, the electric field becomes zero and electrons stop flowing between the capacitors. Once the voltages are equal across the capacitors, the system remains in equilibrium.

The regulated charge sharing circuit of FIG. 5, when coupled between the source and load capacitors, receives the flow of electrons from the lower-charged capacitor to the higher-charged capacitor, and regulates the charge sharing by stabilizing when a voltage across one of the capacitors equalizes with the bias voltage. Depending on whether charge is injected or extracted, and whether the higher voltage capacitor or lower voltage capacitor is used as the stabilization point, the regulated charge sharing circuit of FIG. 5 generally operates in accordance with any of four permutations:

1. In a first case, where a fixed unit of charge is added to a lower voltage capacitor from a higher voltage capacitor through a regulated charge sharing transfer, the feedback loop measures the voltage on the lower voltage capacitor and stops the transfer when the lower voltage capacitor is charged up to the bias voltage. The amount of charge added to the lower voltage capacitor is proportional to the difference in voltage on the lower voltage capacitor before and after the transfer.
2. In a second case, where a fixed unit of charge is added to a lower voltage capacitor from a higher voltage capacitor through a regulated charge sharing transfer, the feedback loop measures the voltage on the higher voltage capacitor and stops the transfer when the higher voltage capacitor is reduced to the bias voltage. The amount of charge added to the lower voltage capacitor is proportional to the difference in voltage on the higher voltage capacitor before and after the transfer.
3. In a third case, where a fixed unit of charge is removed from a higher voltage by a lower voltage capacitor through a regulated charge sharing transfer, the feedback loop measures the voltage on the lower voltage capacitor and stops the transfer when the lower voltage capacitor is charged up to the bias voltage. The amount of charge removed from the higher voltage capacitor is proportional to the difference in voltage on the lower voltage capacitor before and after the transfer.
4. In a fourth case, where a fixed unit of charge is removed from a higher voltage by a lower voltage capacitor through a regulated charge sharing transfer, the feedback loop measures the voltage on the higher voltage capacitor and stops the transfer when the higher voltage capacitor is reduced to the bias voltage. The amount of charge removed from the higher voltage capacitor is proportional to the difference in voltage on the higher voltage capacitor before and after the transfer.

In operation, and further referring to FIG. 5, when the load voltage $V_L$ is lower than the bias voltage $V_{BIAS}$, the coupling resistance $R_{SW}$ between capacitors $C_S$ and $C_L$ is small and charge flows quickly from the source capacitor $C_S$ to the load capacitor $C_L$. This may be seen in FIG. 6, which illustrates the load voltage $V_L$, source voltage $V_S$, and variable resistance $R_{SW}$ during a single charge transfer. When the load voltage $V_L$ approaches the bias voltage $V_{BIAS}$, the coupling resistance $R_{SW}$ between the capacitors increases, until reaching a peak value, at 602, at which point charge flows very slowly, mainly due to leakage in the switches and devices used to construct the variable resistance. The charge sharing transfer completes when the load capacitor $C_L$ accumulates a fixed amount of charge from the source capacitor $C_S$, $\Delta Q$, at 604, at which point the regulated charge sharing circuit 120 can be disconnected from the source capacitor. Once disconnected from the source capacitor $C_S$, the charge transferred to the load capacitor, $Q_L$, can be flushed by resetting the capacitor to ground. This will prepare the load capacitor $C_L$ for use in a later transfer.

Figure 7:
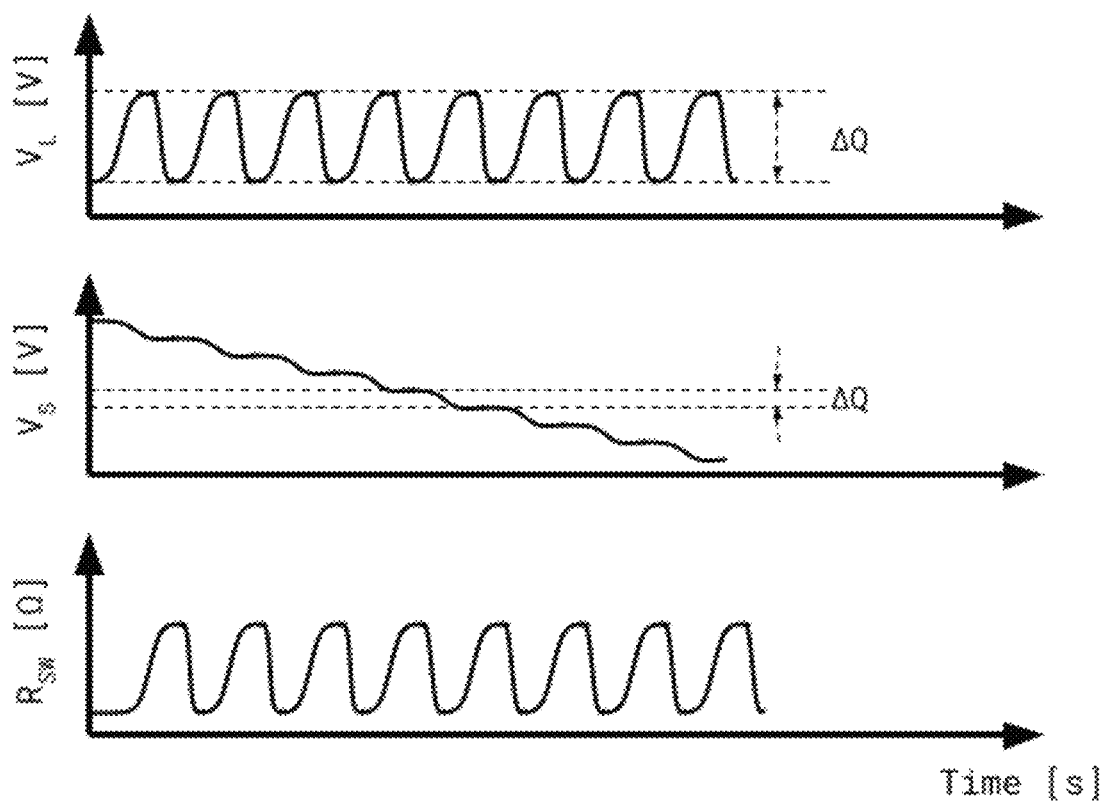
FIG. 7 illustrates the parameters of FIG. 6 shown during multiple charge sharing sequences.

FIG. 7 illustrates a timing chart illustrating the load voltage $V_L$, source voltage $V_S$ and variable resistance $R_{SW}$ during a succession of charge sharing transfers using the regulated charge sharing circuit 120.

Figure 8:
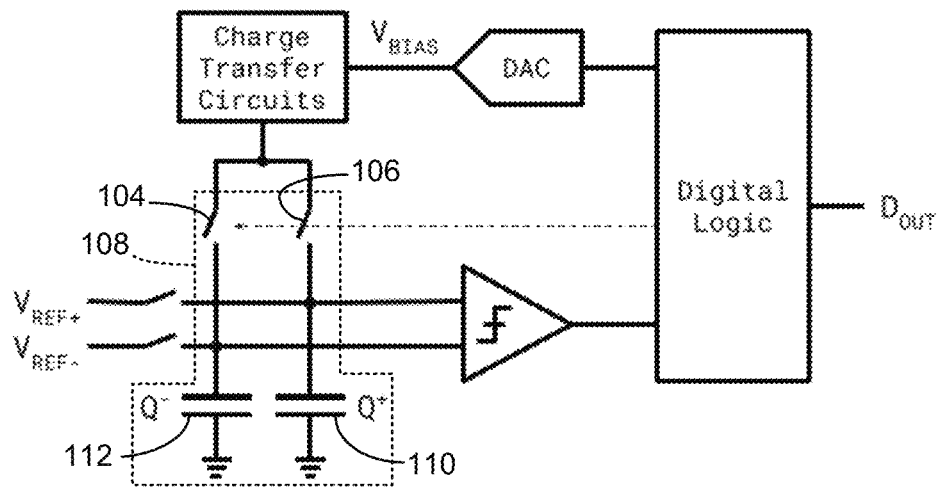
FIG. 8 illustrates the ADC of FIG. 1, configured for a calibration operation.
Figure 9:
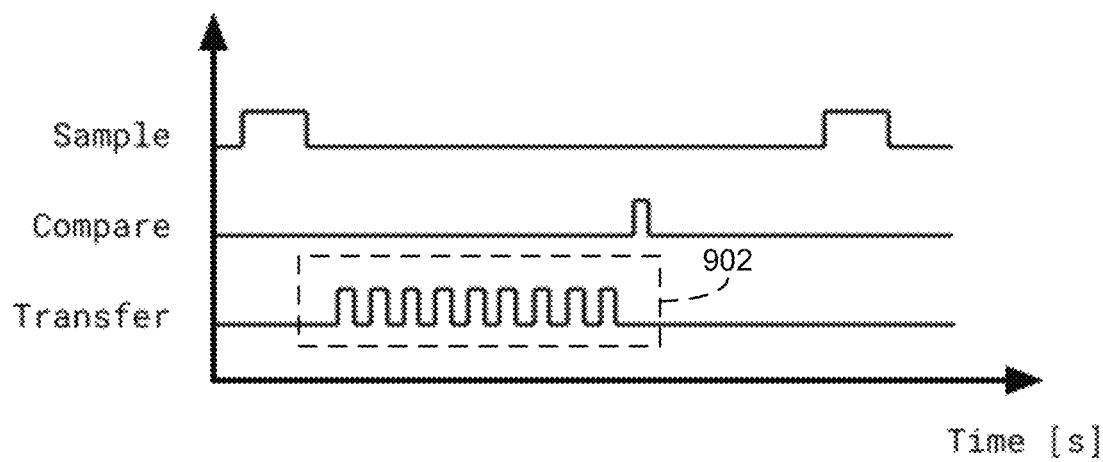
FIG. 9 illustrates a timing chart similar to FIG. 3, during the calibration operation of the ADC of FIG. 1.
Figure 10:
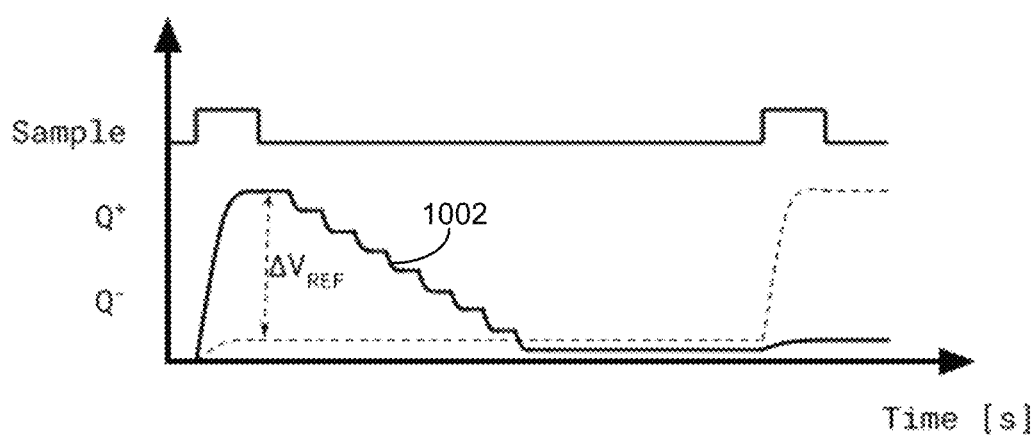
FIG. 10 illustrates a timing chart similar to FIG. 4, during the calibration operation of the ADC of FIG. 1.
Figure 11:
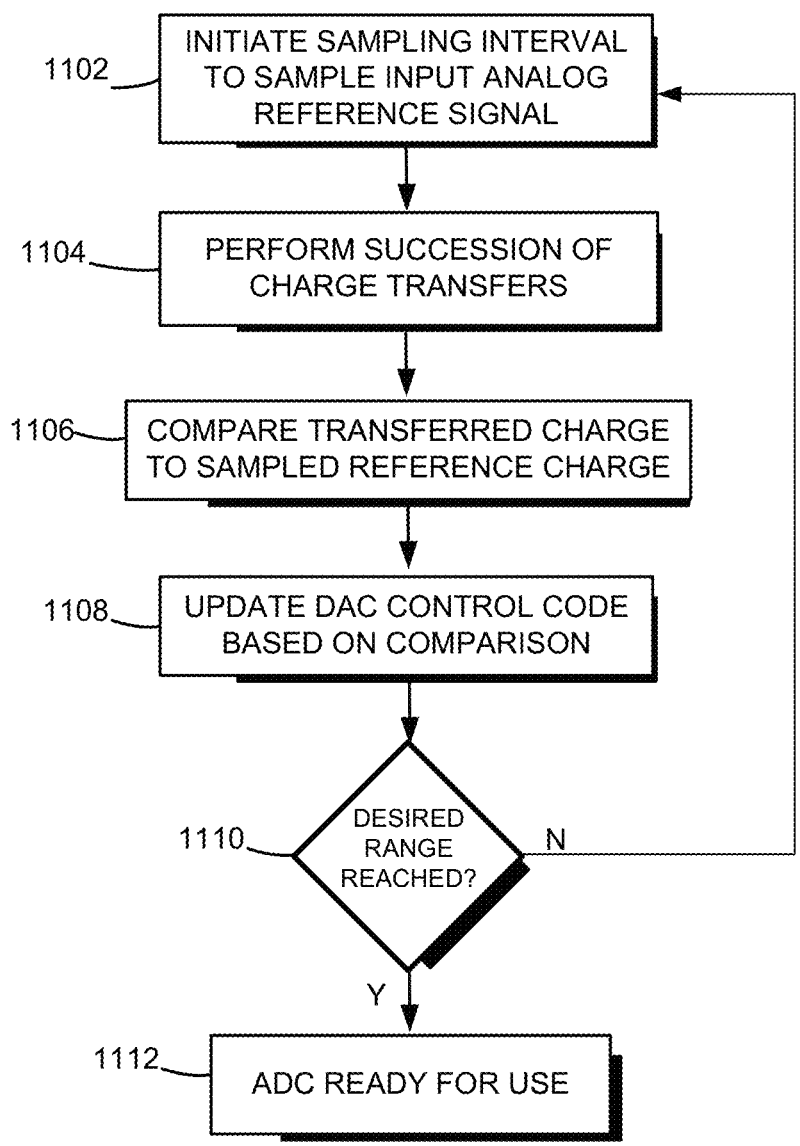
FIG. 11 illustrates method steps involved in one embodiment of calibrating the ADC of FIG. 1.

To maximize accuracy and improve overall stability, one embodiment of the ADC of FIG. 1 employs a calibration process to adjust the input signal range of the ADC prior to normal operation. FIGS. 8-11 illustrate various aspects of the ADC calibration process. FIG. 8 illustrates a calibration configuration for the ADC of FIG. 1, with the input analog voltage $V_{IN}$ replaced by a known reference voltage $V_{REF}$ (shown differentially as $V_{REF-}$ and $V_{REF+}$). FIGS. 9 and 10 illustrate timing charts similar to FIGS. 3 and 4, showing the movement of charge on the capacitor circuits throughout a calibration cycle of the ADC. FIG. 11 illustrates a method of calibrating an ADC.

Referring to FIGS. 8-11, the ADC calibration process begins by connecting the analog reference signal $V_{REF}$ to the sampling circuitry 108 to effect a sampling operation, at 1102 (FIG. 11) via the sampling switches 104 and 106 (FIG. 8). When the sampling switches are closed, the sampling capacitors 110 and 112 are charged to the analog voltage $V_{REF}$. When the sampling switches are open, the sampling capacitors 110 and 112 are isolated from the analog voltage $V_{REF}$ and hold a stored reference charge. Unlike traditional ADC's that often require a precise dedicated reference voltage throughout the entire period of ADC operation, the reference voltage $V_{REF}$ is available for sampling by other ADCS when the switches 104 and 106 are open, if used in a multi-channel configuration.

After sampling is complete, and referring to FIGS. 9-11, a succession of charge sharing transfers is performed, at 1104, based on the expected value of the reference voltage $V_{REF}$. When the sampled reference voltage is positive, the amount of charge stored on the positive capacitor, $Q^+$, is larger than the amount of charge stored on the negative capacitor, $Q^-$, so the charge sharing transfers attempt to equalize the charge on the capacitors by removing charge from the positive capacitor. When the sampled reference voltage is negative, the amount of charge stored on the positive capacitor, $Q^-$, is smaller than the amount of charge stored on the negative capacitor, $Q^-$, so the charge sharing transfers attempt to equalize the charge on the capacitors by removing charge from the negative capacitor. One example of the sequence of charge sharing transfers may be seen at 902, where nine transfers equivalent to $2^{N-1}$ times the least-significant bit (LSB) take place, all involving a same amount of charge being transferred. The movement of charge during the transfers of FIG. 9 are shown in FIG. 10, at 1002.

Figures 12, 13:
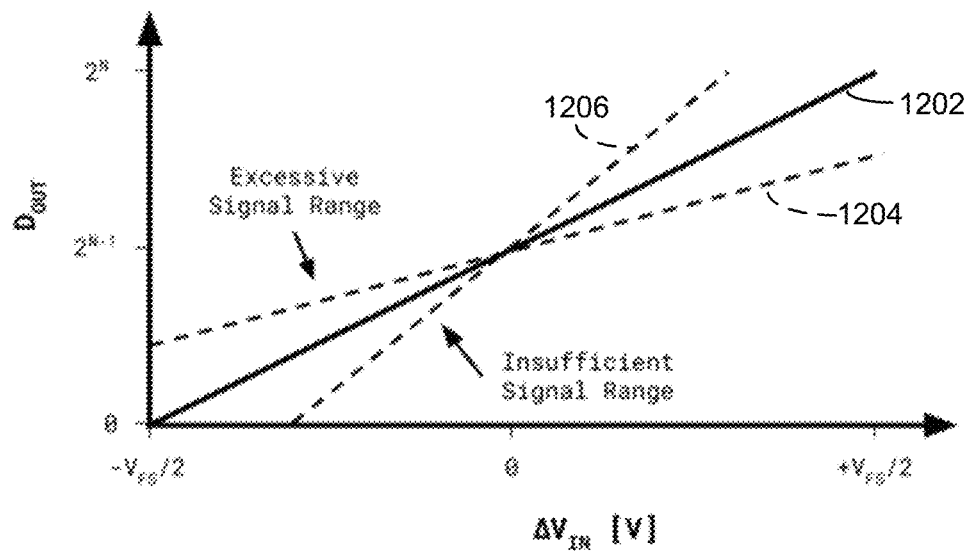
FIG. 12 illustrates a graph showing the effect of input signal range on the transfer function of the ADC of FIG. 1.
FIG. 13 illustrates a table for possible comparator decisions involved in the calibration process of FIG. 11.

For one embodiment, the amount of the charge transferred during the succession of charge sharing transfers is a fixed number representing the desired input signal range of the ADC. FIG. 12 illustrates a graph showing the effect of input signal range $\Delta V_{IN}$ on the transfer function of the ADC (slope of the curve 1202). In an ideal ADC, the specified full scale range and input signal range would match. When a full scale input maps to a range of output codes smaller than ADC resolution, the ADC has excessive signal range, shown at 1204, and when an input range smaller than the full scale range spans the full range of output codes, the ADC has insufficient range, shown at 1206. For sampled references that span the maximum positive input voltage expected by the ADC, the number of charge sharing transfers will be $2^{N-1}$, which represents half of the full scale differential range. For sampled references that span the minimum negative input voltage expected by the ADC, the number of charge sharing transfers will be $2^{N-1}$, which represents half of the full scale differential range.

Figure 14:
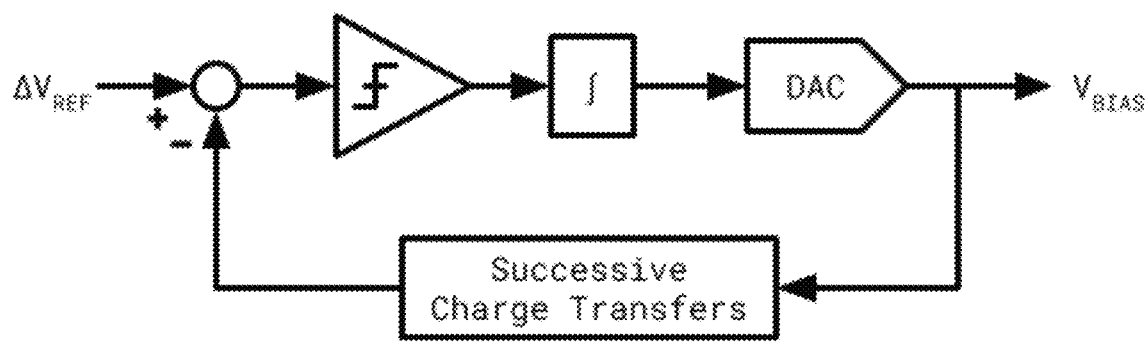
FIG. 14 illustrates a system level diagram showing a feedback loop addressing the possibilities and decisions of the table of FIG. 13.

Following the charge sharing transfers of step 1104, a comparison is performed, at 1106, to determine whether the sum of transferred charge is less than or greater than the sampled reference charge. Based on the sampled reference value, and the comparator decision, a variety of possibilities may be encountered by the ADC during calibration. FIG. 13 enumerates in table format the possibilities and decisions described below. For example, when the sampled reference is positive, and the comparator decision following the transfers is high, both the LSB and output digital signal range of the ADC are smaller than expected since not enough charge has been removed to equalize the capacitors. When the sampled reference is positive and the comparator decision following the transfers is low, both the LSB and output digital signal range of the ADC are larger than expected since too much charge has been removed to equalize the capacitors. When the sampled reference is negative and the comparator decision following the transfers is high, both the LSB and output digital signal range of the ADC are larger than expected since too much charge has been removed to equalize the capacitors. When the sampled reference is negative and the comparator decision following the transfers is low, both the LSB and output digital signal range of the ADC are smaller than expected since not enough charge has been removed to equalize the capacitors. FIG. 14 illustrates a system level diagram showing a feedback loop addressing the possibilities and decisions described above.

Referring back to FIGS. 8 and 11, after the comparison is performed, the digital logic 128 updates the DAC control code, at 1108, to adjust the output digital signal range of the ADC. When the sampled reference is positive and the comparator decision following the transfers is high, the DAC control code is increased which increases the DAC output voltage, $V_{BIAS}$, and the amount of transferred charge, $\Delta Q$, so both the LSB and output digital signal range of the ADC will increase. When the sampled reference is positive and the comparator decision following the transfers is low, the DAC control code is decreased which decreases the DAC output voltage, $V_{BIAS}$, and the amount of transferred charge, $\Delta Q$, so both the LSB and output digital signal range of the ADC will decrease. When the sampled reference is negative and the comparator decision following the transfers is high, the DAC control code is decreased which decreases the DAC output voltage, $V_{BIAS}$, and the amount of transferred charge, $\Delta Q$, so both the LSB and output digital signal range of the ADC will decrease. When the sampled reference is negative and the comparator decision following the transfers is low, the DAC control code is increased which increases the DAC output voltage, $V_{BIAS}$, and the amount of transferred charge, $\Delta Q$, so both the LSB and output digital signal range of the ADC will increase.

Figure 15:
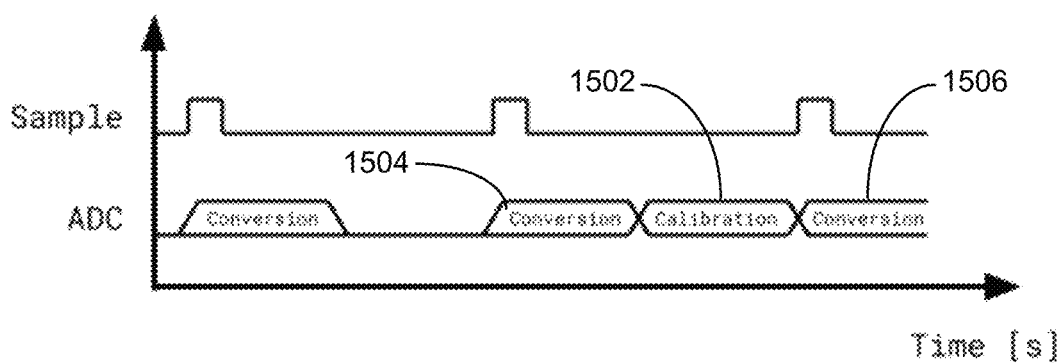
FIG. 15 illustrates a graph showing a background calibration process during single channel operations of the ADC of FIG. 1.
Figure 16:
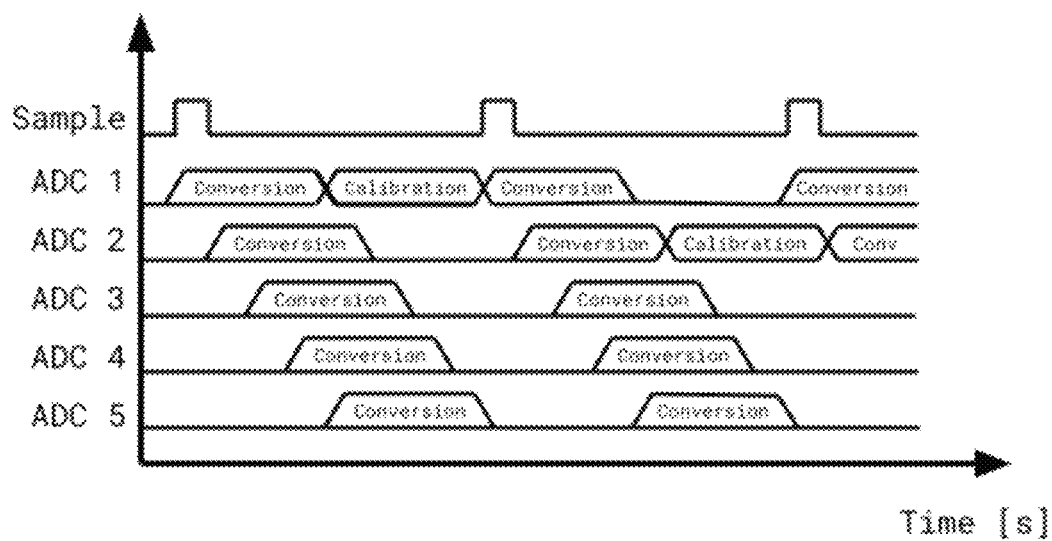
FIG. 16 illustrates a graph showing multiple background calibration operations during multi-channel operation of multiple ADCS of FIG. 1.

In some embodiments, the calibration operation can be performed in the foreground during a power-on initialization routine, or in the background in between conversions. During foreground calibration in the calibration mode, the ADC will determine whether the DAC control code and DAC output voltage VBIAS have generated the desired output digital signal range, at 1110. If not, then the method iterates to continue sampling the reference voltages until the both the DAC control code and the DAC output voltage, $V_{BIAS}$, have stabilized to produce the desired output digital signal range, after which the ADC is ready for use, at 1112. During background calibration, the ADC switches between conversion mode and calibration mode. During single channel use, such as that illustrated in FIG. 15, the ADC background calibration, at 1502, can be scheduled to occur every N cycles, and between adjacent conversion operations, at 1504 and 1506, depending on the desired bandwidth and frequency of update. During multiple channel use, background calibration events can be scheduled amongst the multiple channels such that only one channel calibrates at a time. FIG. 16 illustrates such a situation, where multiple ADCS 1-5 perform staggered or round-robin conversion and calibration operations so that only one channel samples the references during a given time.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. A charge sharing circuit, comprising:
   a charge source having an accumulated first charge;
   a charge load having an accumulated second charge, wherein during a charge sharing interval the second charge is less than the first charge; and
   a charge sharing regulator selectively coupled between the charge source and the charge load along a charge sharing path, the charge sharing regulator including a comparator to regulate transfer of a shared amount of charge from the charge source to the charge load during the charge sharing interval wherein the charge transfer is based on a difference between a bias voltage and a load voltage associated with the charge load.

2. The charge sharing circuit of claim 1, wherein:
   the charge source comprises a first capacitor; and
   the charge load comprises a second capacitor.

3. The charge sharing circuit of claim 2, wherein the charge sharing regulator comprises:
   a variable resistance circuit.

4. The charge sharing circuit of claim 3, wherein the variable resistance circuit comprises:
   a comparator having a bias voltage input to receive a bias voltage, and a load voltage input to receive a load voltage from one of the first capacitor or the second capacitor; and
   an output to generate a variable resistance having a value based on a difference between the bias voltage and the load voltage.

5. The charge sharing circuit of claim 4, wherein:
   the shared amount of charge corresponds to the difference between the bias voltage and the load voltage.

6. The charge sharing circuit of claim 4, further comprising:
   a feedback path to couple the load voltage to the load voltage input of the comparator.

7. The charge sharing circuit of claim 4, wherein:
   the variable resistance increases as the voltage difference decreases.

8. The charge sharing circuit of claim 4, further comprising:
   digital logic to generate the bias voltage based on a user configured setting.

9. The charge sharing circuit of claim 8, further comprising
   switching circuitry disposed in the charge sharing path and responsive to the digital logic to enable charge sharing along the charge sharing path during a fixed period corresponding to the charge sharing interval.

10. A method of operation in a charge sharing circuit, comprising:
    accumulating a first charge at a charge source;
    accumulating a second charge at a charge load, wherein during a charge sharing interval the second charge is less than the first charge; and
    selectively coupling a charge sharing regulator between the charge source and the charge load along a charge sharing path the charge sharing regulator including a comparator; and regulating transfer of a shared amount of charge from the charge source to the charge load during the charge sharing interval wherein the charge transfer is based on a difference between a bias voltage and a load voltage associated with the charge load.

11. The method according to claim 10, wherein the regulating transfer comprises:
feeding back a load voltage associated with the charge load;
comparing the load voltage to a bias voltage; and
wherein the shared amount of charge corresponds to a voltage difference between the bias voltage and the load voltage.

12. The method according to claim 11, further comprising:
generating a variable resistance based on the result of the comparing.

13. The method according to claim 12, wherein the generating a variable resistance comprises:
increasing the variable resistance as the voltage difference decreases.

14. The method according to claim 10, further comprising:
enabling the charge sharing path during the charge sharing interval with switching circuitry.

15. An integrated circuit (IC) chip, comprising:
a first capacitor circuit having an accumulated first charge;
a second capacitor circuit having an accumulated second charge, wherein during a charge sharing interval the second charge is less than the first charge; and
a charge sharing regulator switchably coupled between the first capacitor circuit and the second capacitor circuit along a charge sharing path, the charge sharing regulator including a comparator to regulate transfer of a shared amount of charge between the first capacitor circuit and the second capacitor circuit during the charge sharing interval wherein the charge transfer is based on a difference between a bias voltage and a load voltage associated with the charge load.

16. The IC chip of claim 15, wherein the charge sharing regulator comprises:
a variable resistance circuit.

17. The IC chip of claim 16, wherein the variable resistance circuit comprises:
a comparator having a bias voltage input to receive a bias voltage, and a load voltage input to receive a load voltage from one of the first capacitor circuit or the second capacitor circuit;
a feedback path feeding the load voltage from the one of the first capacitor circuit or the second capacitor circuit to the load voltage input of the comparator; and
an output to generate a variable resistance having a value based on a difference between the bias voltage and the load voltage.

18. The IC chip of claim 17, wherein:
the shared amount of charge corresponds to the difference between the bias voltage and the load voltage.

19. The IC chip of claim 17, further comprising:
digital logic to generate the bias voltage based on a user configured setting.

20. The IC chip of claim 16, further comprising:
switching circuitry disposed in the charge sharing path and responsive to digital logic to enable charge sharing along the charge sharing path during a fixed period corresponding to the charge sharing interval.

* * * * *